United States Patent [19]
Brasen et al.

[11] Patent Number: 5,442,205
[45] Date of Patent: Aug. 15, 1995

[54] SEMICONDUCTOR HETEROSTRUCTURE DEVICES WITH STRAINED SEMICONDUCTOR LAYERS

[75] Inventors: Daniel Brasen, Lake Hiawatha; Eugene A. Fitzgerald, Jr., Bridgewater; Martin L. Green, New Providence; Donald P. Monroe, Berkeley Heights; Paul J. Silverman, Millburn; Ya-Hong Xie, Flemington, all of N.J.

[73] Assignee: AT&T Corp., Murray Hill, N.J.

[21] Appl. No.: 104,513

[22] Filed: Aug. 9, 1993

Related U.S. Application Data

[60] Continuation-in-part of Ser. No. 14,029, Feb. 5, 1993, abandoned, which is a division of Ser. No. 690,429, Apr. 24, 1991, Pat. No. 5,221,413.

[51] Int. Cl.$^6$ .................. H01L 29/161; H01L 29/205; H01L 29/225
[52] U.S. Cl. .......................... 257/191; 257/12; 257/18; 257/19; 257/20; 257/21; 257/22; 257/24; 257/27; 257/54; 257/55; 257/183; 257/190; 257/192
[58] Field of Search .................. 257/12, 18, 19, 20, 21, 22, 24, 27, 54, 55, 183, 190, 191, 192

[56] References Cited

U.S. PATENT DOCUMENTS

| | | | |
|---|---|---|---|
| 3,615,855 | 10/1971 | Smith | 136/89 |
| 3,935,040 | 1/1976 | Mason | 148/175 |
| 4,357,183 | 11/1982 | Fan | 148/181 |
| 4,529,455 | 1/1985 | Bean | 148/175 |
| 4,710,788 | 12/1987 | Dämbkes et al. | 257/191 |
| 4,711,857 | 12/1987 | Cheng | 437/3 |
| 4,857,270 | 8/1989 | Maruya | 420/578 |
| 4,876,210 | 10/1989 | Barnett | 437/5 |
| 4,879,256 | 11/1989 | Bea et al. | 257/19 |
| 4,994,866 | 2/1991 | Awano | 257/190 |
| 5,256,550 | 10/1993 | Laderman et al. | 437/106 |

OTHER PUBLICATIONS

Baribeau, et al. "Growth and characterization of $Si_{1-x}Ge_x$ and Ge epilayers on (100) Si" *J. Appl. Phys.*, pp. 5738–5746 (1988), vol. 63, No. 12.

Kasper, et al. "A One-Dimensional SiGe Superlattice Grown by UHV Epitaxy" *Appl. Phys.* 8, pp. 199–205 (1975).

Christou, P. et al., "Schottky Barrier Formation on Electron Beam Deposited Amorphous $Si_{1-x}Ge_x$: H Alloys and Amorphous $(Si/Si_{1-x}Ge_x)$: H Modulated Structures", *Appl. Phys. Lett.* 48, (6) 10 Feb. 1986, pp. 408–410.

Murakami, K. et al., "Strain-Controlled Si-Ge Modulation-Doped FET with Ultrahigh Hole Mobility," *IEEE Electron Device Letters*, vol. 12, No. 2, Feb. 1991, pp. 71–73.

Konig, U. et al., "p-Type Ge-Channel MODFET's with High Transconductance Grown on Si Substrates," *IEEE Electron Device Letters*, vol. 14, No. 4, Apr. 1993, pp. 205–207.

*Primary Examiner*—Sara W. Crane
*Assistant Examiner*—Alice W. Tang
*Attorney, Agent, or Firm*—David I. Caplan

[57] ABSTRACT

A heterostructure includes a stained epitaxial layer of either silicon or germanium that is located overlying a silicon substrate, with a spatially graded $Ge_xSi_{1-x}$ epitaxial layer overlain by a ungraded $Ge_{x0}Si_{1-x0}$ intervening between the silicon substrate and the strained layer. Such a heterostructure can serve as a foundation for such devices as surface emitting LEDs, either n-channel or p-channel silicon-based MODFETs, and either n-channel or p-channel silicon-based MOSFETs.

23 Claims, 4 Drawing Sheets

SEMICONDUCTOR HETEROSTRUCTURE DEVICES WITH STRAINED SEMICONDUCTOR LAYERS

CROSS-REFERENCE TO RELATED APPLICATION

This application is a continuation-in-part of application Ser. No. 08/014,029 filed on Feb. 5, 1993, now abandoned, which was a division of application Ser. No. 07/690,429 filed on Apr. 24, 1991, now U.S. Pat. No. 5,221,413.

FIELD OF THE INVENTION

This invention relates to semiconductor heterostructures including geranium-silicon alloy layers that have low threading dislocation densities in the alloy layers. Such low defect structures are particularly useful as buffer layers for semiconductor devices composing indium gallium phosphide layers, gallium arsenide layers, or strained layers of silicon or of germanium. The strained layers of silicon or germanium can sere as foundations for n-channel or p-channel transistor devices in silicon-based integrated circuit.

BACKGROUND THE INVENTION

There is considerable interest in heterostructure devices involving greater epitaxial layer thickness and greater lattice misfit than present technology will allow. For example, it has long been recognized that germanium-silicon alloy ($Ge_xSi_{1-x}$) layers grown on silicon substrates would permit a variety of optoelectronic devices, such as LEDs, marrying the electronic processing technology of silicon VLSI circuits with the optical component technology available in direct band semiconductors. Indeed, it has been proposed that an intermediate epitaxial layer of geranium-silicon alloy would permit the epitaxial deposition of gallium arsenide overlying a silicon substrate and thus permit a variety of new optoelectronic devices using silicon electronic components and gallium arsenide optical components. However, despite the widely recognized potential advantages of such combined structures and despite substantial efforts to develop them, their practical utility has been limited by high defect densities in heterostructure layers grown on silicon substrates.

Dislocation defects partition an otherwise monolithic crystal structure and introduce unwanted and abrupt changes in electrical and optical properties. Dislocation defects arise in efforts to epitaxially grow one kind of crystalline material on a substrate of a different and of material due to different crystal lattice sizes of the two materials. Dislocations for at the mismatched interface to relieve the misfit strain. Many of these dislocations have vertical components, termed threading segments, which extend at a slant angle through any subsequent layers. Such threading defects in the active regions of semiconductor devices seriously degrade device performance.

A variety of approaches have been used to reduce dislocations with varying degrees of success. One approach is to limit the heterolayer to a thin layer of material that has a lattice crystal structure closely matching the substrate. Typically the lattice mismatch is within 1% and thickness of the layer is kept below a critical thickness for defect formation. In such structures, the substrate acts as a template for growth of the heterolayer which elastically conforms to the substrate template. While this approach eliminates dislocations in a number of structures, there are relatively few near lattice-matched systems with large energy band offsets. Thus with this approach the design options for new devices are limited.

A second approach set forth in the copending application of E. A. Fitzgerald, Ser. No. 07/561744 filed Aug. 2, 1990, now U.S. Pat. No. 5,158,907 utilizes heterolayers of greater thickness but limited lateral area. By making the thickness sufficiently large as compared with the lateral dimension, threading dislocations are permitted to exit the sides of layer. The upper surface is thus left substantially free of defects. This approach permits the fabrication of a variety of devices and circuits which can be made on limited area surfaces having an area of less than about 10,000 square micrometers.

A third approach is to deposit successive layers of germanium-silicon alloy on a silicon substrate, increasing the germanium content with each successive layer. The goal is to avoid dislocations by spreading the strain among successive layers. Unfortunately this approach has not worked. For example, it has been found that step grading 20% Ge over 2000 angstroms to produce pure Ge results in substantially the same high dislocation density as depositing pure Ge on Si. See J. M. Baribeau et al., 63 *Journal of Applied Physics* 5738 (1988). Applicants believe that this approach fails because at conventional growth temperatures—typically about 550° C.—the initial layer of Si-Ge is almost entirely elastically strained. Thus when the next layer of Si-Ge with greater germanium content is applied, the mismatch between the two Si-Ge layers is nearly that between the initial Si-Ge layer and the Si substrate, resulting in high dislocation density. Accordingly, there is a need for a method of making large area, low defect heterostructures on silicon.

SUMMARY OF INVENTION

Applicants have discovered that by growing germanium-silicon alloy at high temperatures in excess of about 850° C. and increasing the germanium content at a spatial gradient of less than about 25% per micrometer, one can grow on silicon substrates large area heterostructures including heterolayers of graded $Ge_xSi_{1-x}$ alloy having a desirably low density of threading dislocation defects. As used herein the terms "spatially graded" refers to the situation in which layer has a spatial gradient in its composition. With low concentrations of germanium ($0.10 > x \leq 0.50$), the heterolayer can be used as a foundation for growing strained layer n-channel silicon devices such as n-channel MODFETs or n-channel MOSFETs. With high concentrations of Ge ($0.65 \leq x \leq 1.00$) the heterolayer can be used on silicon substrates as a buffer layer for indium gallium phosphide devices such as light emitting diodes and lasers. Also, with high concentrations of Ge ($0.50 < x \leq 0.90$), the heterolayer can be used on silicon substrates as a foundation for growing strained layer p-channel germanium devices such as p-channel MODFETs or p-channel MOSFETs. At concentrations of pure germanium ($x = 1.00$), the heterolayer can be used for GaAs or GaAs/AlGaAs devices.

The above-mentioned MODFETs and the MOSFETs can be integrated into silicon-based integrated circuits.

It is to be understood that only for the purpose of clarity these drawings are not to scale.

DETAILED DESCRIPTION

Figure 1:
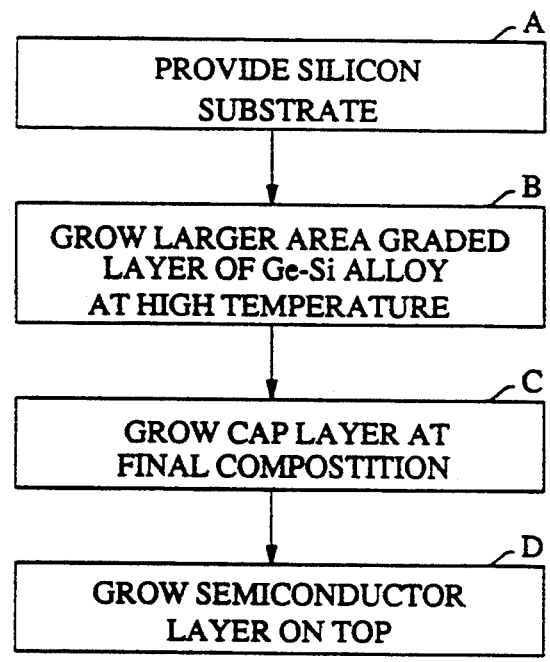
FIG. 1 is a block diagram illustrating the method of making a low defect density semiconductor heterostructure.

Referring to the drawings, FIG. 1 is a flow diagram illustrating the process for making a low defect density semiconductor heterostructure in accordance with the invention. As shown, the first step is providing a silicon substrate. Preferably the substrate is a standard (100) oriented silicon wafer of the type typically used in the fabrication of integrated circuits. Advantageously, as a preliminary step, the substrate is provided with one or more large area recessed tubs by conventional photolithographic patterning and etching. The tubs can have an area in excess of 12,000 square micrometers and a depth of several micrometers, depending upon the thickness of germanium-silicon alloy to be grown. The objective is to provide a tub of proper depth so that a germanium-silicon alloy layer grown in the tub will be substantially coplanar with the non-recessed portion of the silicon substrate.

The second step of the process is to grow at high temperature on the silicon substrate a large area, graded layer of germanium-silicon alloy, $Ge_xSi_{1-x}$. The growth process is preferably chemical vapor deposition (CVD) or molecular beam epitaxy (MBE). The substrate growth starting temperature should be in the range 850° C.–1100° C., and the area of the graded alloy can exceed 12,000 square micrometers. The starting composition is preferably pure silicon. Germanium is introduced to form $Ge_xSi_{1-x}$ at a gradient of less than about 25% per micron. Preferably the grading is linear at a rate of about 10% per micron. Alternatively the grading can be stepwise at similar gradients. As the germanium content of the alloy increases, the growth temperature is advantageously scaled down in proportion to the reduced melting temperature of the alloy. The objective is to avoid melting the alloy. Graded growth of $Ge_xSi_{1-x}$ is continued until a desired final composition is reached.

The choice of final composition depends upon the intended use of the heterostructure. If, for example, the structure is to be used as a substrate for growing a strained silicon channel device, the final Ge concentration should fall within the range of 10–50%. If the structure is to be used for a strained Ge channel device, the final Ge concentration should fall within the range of 50–90%. If, on the other hand, the structure is to be used as a substrate for an indium gallium phosphide device, the final Ge concentration should fall within the range of 65–100%. On the other hand, if the structure is to be used as a substrate for GaAs or GaAs/AlGaAs devices, the Ge concentration is preferably about 100%.

After the desired final composition is reached, an optional cap layer with the same final composition can be grown on the graded layer to a thickness in excess of 100 angstroms and preferably in excess of one micrometer. The effect of the cap layer is to further relax the low level of residual strain at the top of the graded layer.

The fabrication and structure can be understood in greater detail by consideration of the following; specific examples.

Example 1: Heterostructure Substrate (MBE)

A (100) oriented silicon substrate is provided with a large area rectangular tub approximately ten micrometers deep by coveting the major surface with a masking layer of silicon oxide, etching a rectangular opening in the oxide mask to define the periphery of the tub, and then etching the exposed silicon with ethylene-diamine-pyrocatechol (EDP). The EDP etch produces smooth tub surfaces with sidewalls in the (111) planes of the silicon substrate. The substrate is then cleaned with a 3:1 mixture of $H_2SO_4$ and $H_2O_2$ for ten minutes and with buffered HF for 1 minute.

The cleaned substrate is placed in a Riber EVA 32 Silicon MBE Apparatus controlled by a Sentinel III Deposition Rate Controller. The chamber is evacuated to a pressure of less than $10^{-9}$ Torr, and any oxide on the tub surfaces is dissociated by heating the substrate to about 800° C. and applying a low flux silicon beam at a rate of about 0.05 angstrom/s. Silicon growth at higher rate is continued to a thickness of about 0.1 micrometer to form a silicon buffer layer.

After formation of the buffer layer, the substrate temperature is increased to about 900° C. and the graded layer is grown. Graded growth is begun with pure, silicon at a ram of about 3 angstroms per second. The total growth rate is kept constant while introducing germanium at a linear gradient of about 10% per micrometer. The objective is to keep growth near thermal equilibrium. The parameter variations for graded growth to 100% germanium at 10% per micrometer grading are set forth in the Table 1, giving thickness, percent of Germanium, temperature and current rates at various times into growth.

TABLE 1

PARAMETER VARIATIONS FOR 10%/micron GRADING
Starting Rates (Sentinel): Si/Ge = 67.8/0.5

| time into growth (min) | t(μ) | Ge % | liquidus (C/K) | % T | T substrate (C) | Current Rates (Sentinel): Si/Ge |
|---|---|---|---|---|---|---|
| 0 | 0 | 0 | 1414/1687 | 100 | 900 | 67.8/0.5 |
| 27 | 0.486 | 5 | 1402/1675 | 99.3 | 892 | 64.4/3.5 |
| 54 | 0.972 | 10 | 1390/1663 | 98.6 | 884 | 61.0/6.7 |
| 81 | 1.458 | 15 | 1375/1648 | 97.7 | 873 | 57.6/10.5 |
| 108 | 1.944 | 20 | 1362/1635 | 96.9 | 864 | 54.2/14.0 |
| 135 | 2.430 | 25 | 1350/1623 | 96.2 | 855 | 50.9/17.5 |
| 162 | 2.916 | 30 | 1335/1608 | 95.3 | 845 | 47.5/21.0 |
| 189 | 3.402 | 35 | 1320/1593 | 94.4 | 834 | 44.1/24.5 |
| 216 | 3.888 | 40 | 1305/1578 | 93.5 | 824 | 40.7/28.0 |

TABLE 1-continued

| PARAMETER VARIATIONS FOR 10%/micron GRADING Starting Rates (Sentinel): Si/Ge = 67.8/0.5 | | | | | | |
|---|---|---|---|---|---|---|
| time into growth (min) | t(μ) | Ge % | liquidus (C/K) | % T | T substrate (C) | Current Rates (Sentinel): Si/Ge |
| 243 | 4.374 | 45 | 1290/1563 | 92.6 | 813 | 37.3/31.5 |
| 270 | 4.860 | 50 | 1270/1543 | 91.5 | 800 | 33.9/34.9 |
| 297 | 5.346 | 55 | 1255/1528 | 90.6 | 790 | 30.5/38.4 |
| 324 | 5.832 | 60 | 1235/1508 | 89.4 | 776 | 27.1/41.9 |
| 351 | 6.318 | 65 | 1210/1483 | 87.9 | 758 | 23.7/45.4 |
| 378 | 6.804 | 70 | 1185/1458 | 86.4 | 740 | 20.3/48.9 |
| 405 | 7.290 | 75 | 1160/1433 | 84.9 | 722 | 17.0/52.4 |
| 432 | 7.776 | 80 | 1130/1403 | 83.2 | 703 | 13.6/55.9 |
| 459 | 8.262 | 85 | 1100/1373 | 81.4 | 681 | 10.2/59.4 |
| 486 | 8.748 | 90 | 1055/1328 | 78.7 | 650 | 6.8/62.9 |
| 513 | 9.234 | 95 | 1010/1283 | 76.0 | 618 | 3.4/66.4 |
| 540 | 9.720 | 100 | 938/1211 | 71.8 | 569 | 0.5/69.9 |

After 100% germanium is reached, a final germanium cap layer having a thickness in the range between 1000 angstroms and one micrometer is grown on top.

Structures with less than 100% germanium can be obtained by terminating graded growth at the desired germanium concentration and growing the final cap layer at that concentration.

Example 2: Heterostructure Substrate (CVD)

As preliminary steps, a 100 mm (100) Si wafer was cleaned in dilute HF (1% in $H_2O$) and spin-dried in $N_2$. The wafer was loaded into an RTCVD reactor and pumped down to a base pressure of $10^{-7}$ Torr. The wafer was heated to 1000° C. for 15 seconds in flowing $H_2$ (3 lpm) to remove residual oxygen and carbon, and then cooled in 2 seconds to 900° C.

After these preliminary steps, deposition was commenced by depositing a Si buffer layer approximately 1000 Å thick. This was accomplished using $SiH_2Cl_2$ (1% in $H_2$, 1 lpm) for 1 minute at a pressure of about 4 Torr. Immediately thereafter, $GeH_4$(1% $GeH_4$ in $H_2$) was introduced gradually to create a Si-Ge alloy layer that increased from 0 to 50% Ge. The $GeH_4$ flow can be increased by 4 sccm flow increments every 40 seconds. The $SiH_2Cl_2$ was decreased by the same flow increment in the same time scale; thus, the total $GeH_4$ and $SiH_2Cl_2$ flow was maintained at 1 lpm. Deposition at 900° C. resulted in a Si-Ge graded alloy layer that continually relaxed as it was grown.

Heterostructures fabricated as described in Examples 1 and 2 demonstrate a reduction in defects as compared with conventionally fabricated heterostructures. Triple crystal X-ray diffraction shows that for $0.10 < x < 0.50$, the layers are totally relaxed. The $Ge_xSi_{1-x}$ cap layers, when examined by plan-view and cross-sectional transmission electron microscopy are threading dislocation free. Electron beam induced current images revealed low threading dislocation densities of $4 \times 10^5 \pm 5 \times 10^4$ $cm^{-2}$ for $x = 0.25$ and $3 \times 10^6 \pm 2 \times 10^6 cm^{-2}$ for $x = 0.50$. Photoluminescence spectra from the cap layers are substantially identical to photoluminescence from bulk $Ge_xSi_{1-x}$.

These low defect heterostructures can serve as buffer layers for epitaxially growing a wide variety of devices varying from those employing strained layers of silicon to those employing III-V semiconductors.

Figure 2:
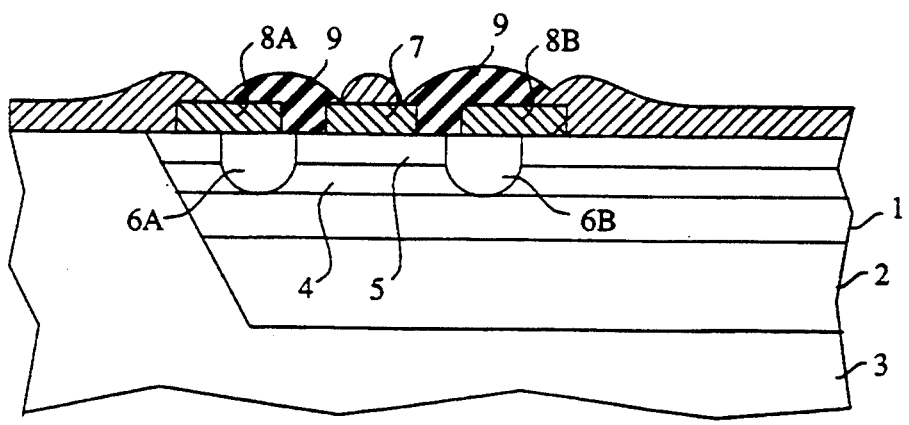
FIG. 2 is a schematic cross section of a strained silicon layer MODFET.

FIG. 2 is a schematic cross section of a device employing a low defect heterostructure to produce a strained silicon MODFET. In essence the MODFET is fabricated on a heterostructure comprising nominally undoped ungraded $Ge_xSi_{1-x}$ alloy cap layer 1 grown on a nominally undoped graded GeSi alloy layer 2, all disposed on a slightly p-type silicon substrate 3, viz., a slightly p-type silicon substrate 3 having an acceptor impurity concentration of the order of $10^{15}$ per $cm^2$—i.e., to within a factor of approximately five. The heterostructure is fabricated as described above, with a maximum concentration of germanium in the approximate range $(0.10 \leq x < 0.50)$ and preferably approximately with $x = 0.30$.

The MODFET fabricated on the heterolayer comprises, in essence, a strained layer of silicon 4 epitaxially grown on layer 1. Another layer 5 of $Ge_xSi_{1-x}$ alloy (initially intrinsic but purposely n-doped after 50-to-900 angstroms) is grown over the silicon and, $n^+$ spaced apart contact regions 6A and 6B are formed to contact the strained silicon layer 4. Ohmic contacts 8A and 8B are made with the $n^+$ contact regions 6A and 6B, and a Schottky barrier contact 7 to layer 5 is disposed between the spaced apart ohmic contacts. A dielectric layer 9 advantageously separates the contacts 7, 8A, and 8B.

Silicon layer 4 preferably has a thickness in the range 100 angstroms to 1000 angstroms and is preferably undoped.

$Ge_xSi_{1-x}$ layer 5 preferably has a thickness in the range 50 angstroms to 1000 angstroms. Layer 5 is modulation doped: preferably intrinsic for the first 50-to-900 angstroms and then $n^+$ doped with a donor impurity such as antimony, phosphorus or arsenic to a concentration in the approximate range of $1 \times 10^{17}/cm^3 - 5 \times 10^{18}/cm^3$. Layer 5 preferably has a concentration of Ge not less than that of cap layer 1.

The $n^+$ contact regions 6A and 6B are preferably formed by implanting antimony, arsenic or phosphorus to silicon layer 4 at a concentration of $10^{19}/cm^3$. The ohmic contacts 8A and 8B can be layers of aluminum and the Schottky contact 7 can be a layer of platinum. As known in the art, these contact layers 8A and 8B, as well as the Schottky contact 7, can be interconnected with other parts of an electronic circuit (not shown) integrated on the silicon substrate 3.

The resulting MODFET acts as a field effect transistor with the advantage of higher speed. The application of a signal voltage bias to the Schottky contact 7 (commonly known as the gate) changes the electron density inside the Si layer 4, which in turn changes the sheet conductance of the channel between the contacts 8A and 8B and result in transistor action. The strained silicon layer 4 is a particularly high speed path for at least three reasons: 1) the straining of the silicon layer 4 alters the energy bands of the silicon to favor conduction by low effective mass, high mobility electrons, 2) the silicon layer 4 is free of impurities to interfere with electron flow between the contacts 8A and 8B, and 3) the silicon layer 4 grown on a low defect substrate has a low concentration of defects to interfere with electron flow.

The foregoing MODFET is thus an n-channel transistor device. In order to build a p-channel device, the graded layer 2 is grown in similar manner as described above, except that the silicon substrate 3 in this case is advantageously slightly n-type and that the maximum relative concentration of germanium to silicon in the graded layer 2 is increased to a value above 0.50, advantageously in the approximate range of 0.60 to 0.90, typically approximately 0.70. At the same time, the cap layer 1 has its (spatially ungraded) germanium concentration increased, advantageously to a value approximately equal to the maximum value of germanium concentration selected for the graded layer 2. Moreover, the strained layer 4 is undoped germanium instead of silicon, and the concentration of germanium in the layer 5 is advantageously approximately the same as the (increased) concentration of germanium in the cap layer 1. Finally, the contact regions 6A and 6B are doped with an acceptor impurity such as boron, as is a top portion of the layer 5 as described above (i.e., "modulation doped") except that the impurity in this p-channel MODFET case is changed from a donor to an acceptor such as boron.

The layers 1 and 2, as deposited, tend to be p-type instead of undoped, even if the deposition process is implemented with no purposeful introduction of any acceptor impurities, especially if the growth process is interrupted for a polishing (planarizing) step. In order to avoid a potential problem that could be caused by such p-type layers 1 and 2 in p-channel MODFETs, advantageously a thin donor-doped (n-type) region ("charge sheet") is introduced in the midst of the layer 2: typically formed by the donor antimony to a surface concentration of the order of $10^{13}$ per square centimeter (i.e., to within a factor of five).

Figure 3:
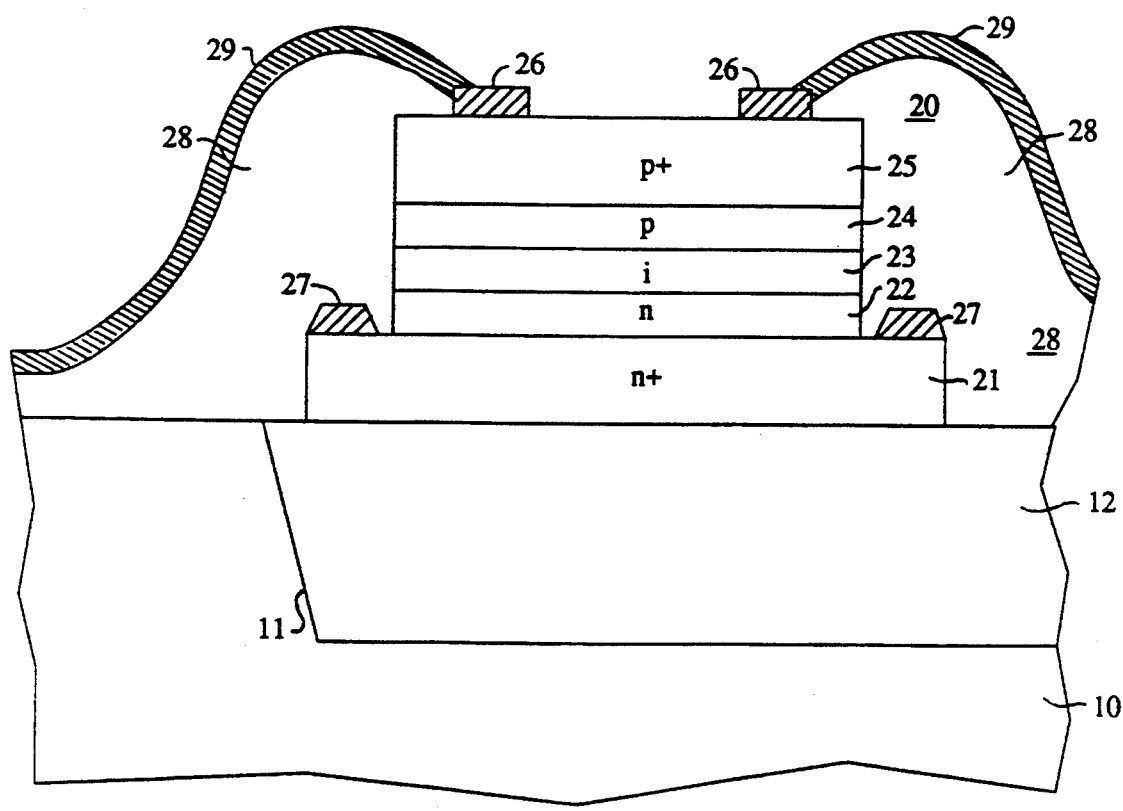
FIG. 3 is a schematic cross section of an indium gallium arsenide surface emitting LED.

FIG. 3 is a schematic cross section of an indium gallium arsenide surface emitting LED fabricated on a heterolayer. Specifically, the LED 20 is fabricated on a heterostructure comprising a $Ge_xSi_{1-x}$ layer 12 grown within a large area tub 11 on a silicon substrate 10. The heterostructure is fabricated essentially as described above, except that the $Ge_xSi_{1-x}$ is doped with p-type (acceptor) impurities, such as Be, to a concentration of approximately $10^{18}$ cm$^{-3}$.

The LED 20 is fabricated on the $Ge_xSi_{1-x}$ using conventional processes such as chemical beam epitaxy to form the constituent layers 21–25 whose thicknesses, constituency and doping are set forth in Table 2 below:

TABLE 2

| Layer No. | Composition | Thickness | Dopant | Concentration |
|---|---|---|---|---|
| 21 | $In_y(Ga_{1-z}Al_z)_{1-y}P$ | 1 micrometer | n+ (Si) | $10^{18}$ cm$^{-3}$ |
| 22 | $In_w(Ga_{1-x}Al_x)_{1-w}P$ | 0.5 micrometer | n(Si) | $10^{17}$ cm$^{-3}$ |
| 23 | $In_u(Ga_{1-v}Al_v)_{1-u}P$ | 0.2 micrometer | none | intrinsic |
| 24 | $In_w(Ga_{1-x}Al_x)_{1-w}P$ | 0.5 micrometer | p(Be) | $10^{17}$ cm$^{-3}$ |
| 25 | $In_y(Ga_{1-z}Al_z)_{1-y}P$ | 1 micrometer | p+ (Be) | $10^{18}$ cm$^{-3}$ |

After the constituent layers are grown, the next step is to form ohmic contacts and to isolate the device. Ohmic contact 26 is formed to contact p-doped layer 25 by depositing a layer of gold-zinc alloy and photolithographically patterning the metal to form a annular ring.

To isolate the diode, the portion of layers 22–25 outside the metal contact ring 26 can be etched away. Using a photoresist circle as a mask, a mesa is etched around ring 26 terminating on n-doped layer 21. Preferably etching is by reactive ion etching in order to obtain a mesa with vertical side walls around the periphery of ring 26.

Next ohmic contact 27 is made with the now exposed n-doped layer 21 as by depositing a layer of gold-germanium alloy and photolithographically defining annular contact ring 27 around the mesa. For further isolation, a mesa concentric with ring 27 can be chemically etched through layer 21.

The final steps involve depositing passivating insulating layers 28 and forming metal interconnects 29 to contacts 26 and 27 in accordance with techniques well known in the art. The interconnects can advantageously extend to integrated electronic circuitry (not shown) formed on the silicon substrate.

In operation, a DC bias voltage applied between contacts 26 and 27 induces emission of light through the center of ring 26.

A particular advantage of this embodiment is that the composition of the $Ge_xSi_{1-x}$ layer can be chosen to lattice match a variety of indium gallium phosphide compounds giving a wide choice of emission wavelengths. For example, when the indium gallium phosphide compound matches a Ge-Si buffer with 65–70% Ge, the emission is green whereas a compound lattice matched to 100% Ge emits red. Thus much of the visible range can be covered.

Figure 4:
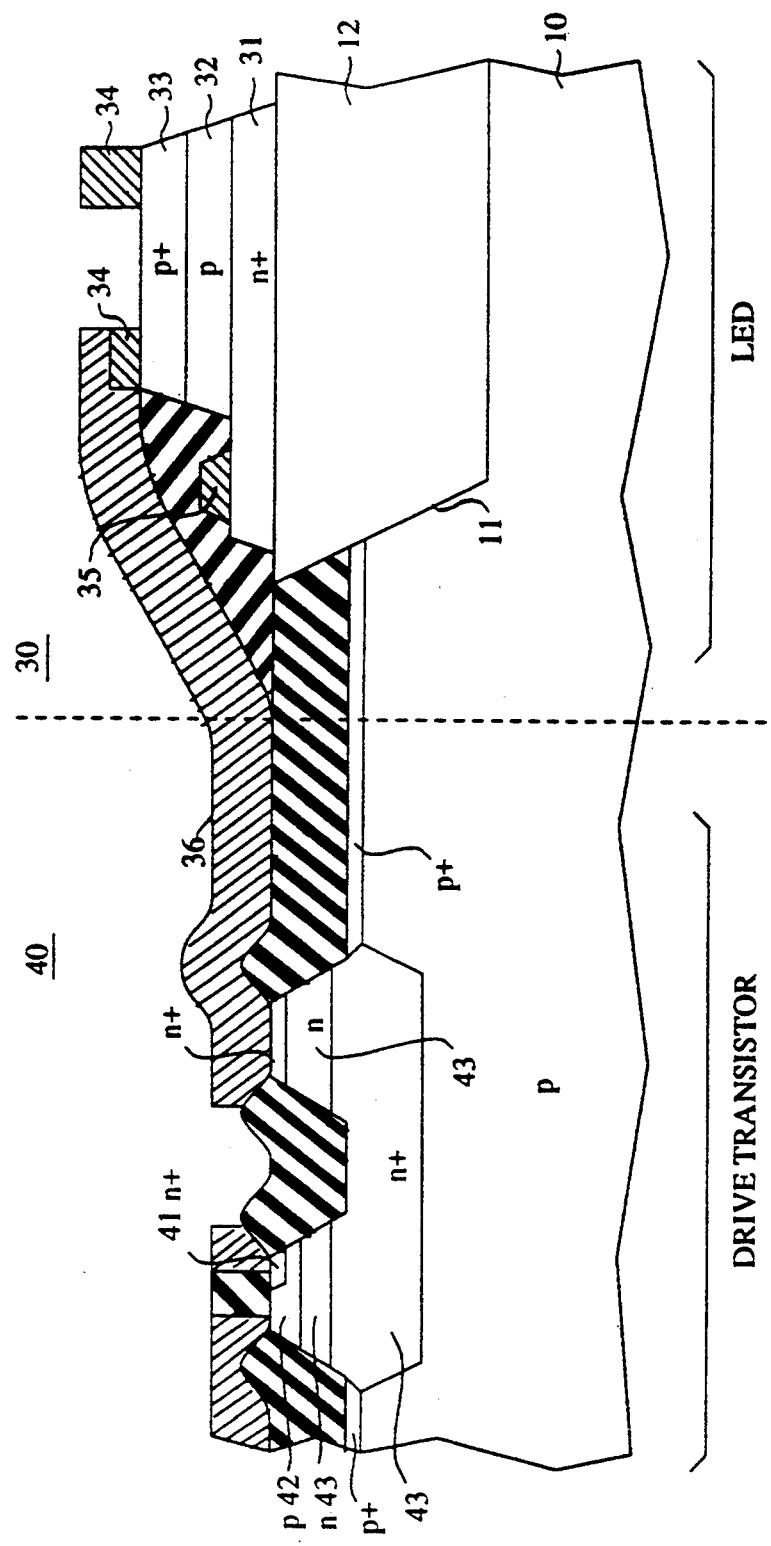
FIG. 4 is a schematic cross section of a gallium arsenide LED with integrated drive transistor.

FIG. 4 is a schematic cross section of a GaAs surface emitting LED fabricated on a heterolayer. In particular, the LED 30 is fabricated on a heterostructure comprising a $Ge_xSi_{1-x}$ layer 12 grown within a large area tub 11 on a silicon substrate 10. In addition the LED is shown connected via a metal lead 36 to a drive transistor 40 integrally formed in silicon substrate 10.

The $Ge_xSi_{1-x}$ layer is formed in tub 11 as described in Example 1 above. The $Ge_xSi_{1-x}$ is preferably undoped and achieves a final composition consisting essentially of pure germanium in order to lattice match the materials of LED 30.

LED 30 comprises a layer of n-doped $Al_yGa_{1-y}As$ 31 grown on the Ge surface, as by MBE, a layer of p-doped GaAs 32 grown on layer 31 and a layer 33 of p+ doped $Al_yGa_{1-y}As$ grown on layer 32. The LED has an annular p-type ohmic contact 34 to layer 33 and an n-type ohmic contact 35 to layer 31.

In a specific structure, n-layer 31 can be doped with silicon to a concentration of $10^{18}$/cm$^3$ and have a thickness of 0.5 micrometer, p-layer 32 can be doped with Be to a concentration of $10^{16}$/cm$^3$ and have a thickness of 0.6 micrometer. P+ layer 32 can be doped with Be to $10^{19}$/cm$^3$ and have a thickness of 0.5 micrometers. The n-contact 35 can be a composite layer of nickel, titanium and gold, and the p-contact 34 can be AuBe alloy. The LED 30 can be connected to transistor 40 with aluminum interconnects 36.

Drive transistor 40 consists essentially of an n-type emitter 41, a p-type base 42 and an n-type collector 43 integrally fabricated on silicon substrate 10 in accordance with conventional techniques well known in the art.

This example illustrates the important advantage that the invention permits silicon electronic components (e.g. transistor 40) and III-V semiconductor optical components (e.g. LED 30.) to be fabricated on the same substrate. Clearly, much more complex circuits can be fabricated on the structure.

Figure 5:
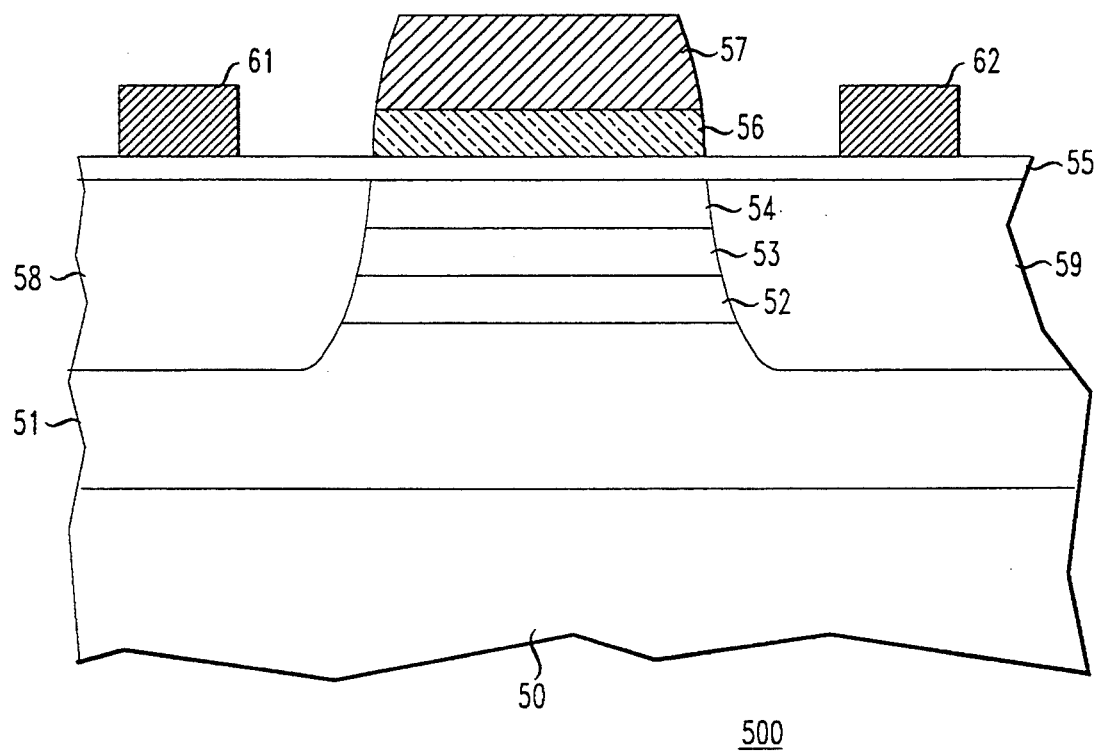
FIG. 5 is a schematic cross section of a strained germanium layer MOSFET in accordance with another embodiment of the invention.

FIG. 5 is a schematic cross section of a heterostructure to produce a p-channel MOSFET (Metal Oxide Semiconductor Field Effect Transistor) device 500 integrated on a silicon substrate 50. The device 500 has source and drain regions 58 and 59, respectively, and a channel that is supplied by a strained epitaxial layer 53 of undoped Ge. During electrical operation if it is desired that the device 500 be on, advantageously voltages are applied—typically from other parts of an electronic circuit (not shown) integrated on the substrate 50—to a metallized source layer contact 61, a polysilicon gate layer 57, and a metallized drain layer contact 62 of such magnitudes as to create a degenerate two-dimensional hole gas in this strained layer 53. As known in, the art, such a hole gas supplies a desirably low electrical resistance channel between a pair of source and drain electrodes such as contacts 61 and 62, respectively.

The MOSFET device 500 further includes a nominally undoped, spatially graded buffer layer 51 of $Si_{1-x}Ge_x$ alloy; a nominally undoped, ungraded relaxed buffer layer 52 of $Si_{1-x_0}Ge_{x_0}$ alloy with $X_0$ approximate range of 0.50 to 0.90, preferably higher than approximately 0.60, and typically approximately 0.70; a relaxed, nominally undoped, spatially ungraded layer 54 of $Si_{1-x_0}Ge_{x_0}$ alloy; a strained undoped layer 55 of Si; and a silicon dioxide layer 56.

More specifically, the substrate 50 is monocrystalline, slightly n-type, typically oriented (100). A graded buffer layer 51 of nominally undoped $Si_{1-x}Ge_x$ alloy is epitaxially grown on this substrate 50 in a similar manner as the graded buffer layer 2 (FIG. 2) except that x varies smoothly from x=0 at the interface with the top surface of the Si substrate 50 to $x=x_0$ at the top surface of this buffer layer 51, where typically the value of $x_0$ is equal to approximately 0.70. The graded buffer layer 51 has a spatial grading rate that is typically equal to approximately 0.10/ μm.

On the top surface of the graded buffer layer 51, a nominally undoped, ungraded, relaxed buffer layer 52 of $Si_{1-x}Ge_x$ alloy, with $x=x_0$ throughout, is epitaxially grown to a thickness advantageously in the approximate range of 0.1-to-2.0 μm, typically approximately 0.2 μm. Next, on the top surface of this ungraded buffer layer 52, an undoped strained layer 53 of Ge is epitaxially grown to a thickness advantageously in the approximate range of 5-to-50 nm, typically approximately 20 nm. Then, on the top surface of this strained layer 53, the nominally undoped, ungraded, relaxed spacer buffer layer 54 is epitaxially grown to a thickness advantageously in the approximate range of 2-to-100 nm, typically approximately 5 nm.

Next, an undoped silicon layer is epitaxially grown on the top surface of the upper buffer layer 54. This silicon layer is then oxidized from the top down, either in steam or in dry oxygen, whereby a silicon dioxide layer is formed overlying the (remaining) silicon layer 55, the latter having thickness advantageously equal to approximately 2 nm or less. A doped polysilicon layer is then formed on the silicon dioxide layer. These polysilicon and silicon dioxide layers are selectively etched, as by standard photolithographic techniques, whereby the doped polysilicon gate layer 57 and the (self-aligned) silicon dioxide layer 56 remain overlying only a limited portion of the silicon layer 55. Then the source and drain regions 58 and 59 are formed, as by acceptor impurity ion implantation, typically with ions of boron. Finally, the metallized contacts 61 and 62, typically of aluminum, are provided, as known in the art, for interconnecting the MOSFET device 500 with other parts of the electronic circuit (not shown) integrated on the silicon substrate 50.

Again, as in the case of the above-described p-channel MODFET, a potential problem can arise in a p-channel MOSFET device stemming from the unwanted tendency of the layers 51 and 52 to be p-type. In order to avoid the problem, a donor-doped charge sheet is introduced in the midst of the layer 52 (in essentially the same way as the above-described donor-doped charge sheet in the abovedescribed layer 2 for the p-channel MODFET). This charge sheet includes donor impurities, such as antimony, and is located within the layer 52.

In the event that the donor-doped charge sheet is introduced into the layer 52, advantageously the bottom boundaries of the source and drain regions 58 and 59 do not extend below the level of the top of this charge sheet.

Moreover, the threshold voltage of the p-channel MOSFET device can be adjusted by introducing a charge sheet advantageously of acceptor impurities, such as boron, in the midst of the buffer layer 52 or of the spacer layer 54, or of both of these layers 52 and 54, to the extent of a surface concentration of the order of (i.e., to within a factor of five) $10^{12}$ per square centimeter.

In order to build an n-channel MOSFET device similar in structure to the p-channel device 500, the strained epitaxial layer 53 is undoped silicon; the silicon substrate 50 is advantageously slightly p-type; and $X_0$ advantageously is in the approximate range of 0.10-to-0.50, preferably less than 0.40, and typically approximately 0.30. Moreover, the source and drain regions 61 and 62 are doped with donor impurities such as phosphorus or arsenic instead of boron. Likewise, the threshold voltage of this n-channel MOSFET can be adjusted by introducing a charge sheet or charge sheets at the same location(s) as in the above-described case of the p-channel MOSFET except that the impurities in the case of the n-channel MOSFET are donor impurities such as antimony or arsenic.

Because of the fact that advantageously all processing temperatures for the (n-channel or p-channel) MOSFET device 500 should be less than approximately 850° C. for one-half hour in to avoid unwanted diffusions of the charge sheet(s), instead of doped polysilicon the gate layer 57 is advantageously $Si_{1-y_0}Ge_{y_0}$ with $Y_0$ in the approximate range of 0.10 to 0.90, typically approximately 0.5, and is doped by (donor or acceptor, respectively) ion implantation, preferably at the same time as the source and drain implantation, as understood in the art of self-aligned gate MOSFETs.

It is to be understood that the above-described embodiments are illustrative of only a few of the, many possible specific embodiments which can represent applications of the principles of the invention. Numerous and varied other arrangements can be made by those skilled in the art without departing from the spirit and scope of the invention.

We claim:
1. A heterostructure comprising
   (a) a monocrystalline silicon substrate;
   (b) a spatially graded epitaxial layer of germanium-silicon located on the silicon substrate and forming an interface therewith, the spatially graded epitaxial layer having a spatial gradient of germanium that is less than about 25 percent per micrometer, and the spatially graded epitaxial layer having a concentration of germanium that is equal to approximately zero at the interface;

(c) a first spatially ungraded epitaxial layer of germanium-silicon located on the spatially graded epitaxial layer;

(d) an epitaxial layer of germanium or silicon located on the first spatially ungraded epitaxial layer of germanium-silicon;

(e) a second spatially ungraded epitaxial layer of germanium-silicon located on the epitaxial layer of germanium or silicon.

2. An integrated circuit comprising the heterostructure of claim 1.

3. In an integrated circuit, the heterostructure of claim 1.

4. The heterostructure of claim 1 further comprising first and second spaced-apart contact regions for electrically contacting the epitaxial layer of germanium or silicon, and first and second metallic contacts to the first and second contact regions, respectively.

5. An integrated circuit comprising the heterostructure of claim 4.

6. In an integrated circuit, the heterostructure of claim 4.

7. The heterostructure of claim 4 further comprising an epitaxial layer of silicon located on the second spatially ungraded epitaxial layer, a silicon dioxide layer overlying the epitaxial layer of silicon, and a polysilicon gate layer overlying the silicon dioxide layer.

8. An integrated circuit comprising the heterostructure of claim 7.

9. In an integrated circuit, the heterostructure of claim 7.

10. An integrated circuit comprising the heterostructure of claim 1.

11. In an integrated circuit, the heterostructure of claim 1.

12. A MODFET device comprising
a monocrystalline silicon substrate;
a spatially graded epitaxial layer of germanium-silicon located on the silicon substrate and forming an interface therewith, the spatially graded epitaxial layer having a spatial gradient of germanium that is less than about 25 percent per micrometer, and the spatially graded epitaxial layer having a concentration of germanium that is equal to approximately zero at the interface;
a first layer of germanium-silicon alloy located on said spatially graded epitaxial layer and having a germanium concentration in the range between 10 percent and 50 percent;
a layer of strained silicon epitaxially grown on said first layer of alloy;
a second layer of germanium-silicon alloy epitaxially grown on said strained silicon layer, said second layer including a pair of spaced apart contact regions for electrically contacting said silicon layer;
source and drain ohmic contacts means disposed on said second layer of alloy for contacting said contact regions,
Schottky barrier contact means disposed between said source and drain contact means, whereby conduction between said source and drain is enhanced by application of a negative voltage to said Schottky contact.

13. An integrated circuit comprising the device of claim 12.

14. In an integrated circuit, the device of claim 12.

15. A device comprising:
a monocrystalline silicon substrate;
a spatially graded expitaxial layer of germanium-silicon located on the silicon substrate and forming an interface therewith, the spatially graded epitaxial layer having a spatial gradient of germanium that is less than about 25 percent per micrometer, and the spatially graded epitaxial layer having a concentration of germanium that is equal to approximately zero at the interface;
a layer of germanium-silicon alloy $Ge_xSi_{1-x}$ ($0.10 \leq x \leq 0.50$) located on said spatially graded epitaxial layer and having a threading dislocation density of less than $5 \times 10^6 cm^{-2}$;
a strained layer of silicon epitaxially grown on said layer of alloy;
a second layer of germanium-silicon alloy epitaxially grown on said strained layer of silicon; and
first and second spaced-apart impurity-doped regions located in said strained silicon layer.

16. An integrated circuit comprising the device of claim 15.

17. In an integrated circuit, the device of claim 15.

18. A device according to claim 15 wherein said strained layer of silicon is undoped.

19. An integrated circuit comprising the device of claim 18.

20. In an integrated circuit, the device of claim 18.

21. A device according to claim 15 wherein at least one of said layers of germanium-silicon alloy is n-doped.

22. An integrated circuit comprising the device of claim 21.

23. In an integrated circuit, the device of claim 21.

* * * * *